US006917237B1

(12) United States Patent
Tschanz et al.

(10) Patent No.: US 6,917,237 B1
(45) Date of Patent: Jul. 12, 2005

(54) TEMPERATURE DEPENDENT REGULATION OF THRESHOLD VOLTAGE

(75) Inventors: James W. Tschanz, Portland, OR (US); Mircea R. Stan, Charlottesville, VA (US); Siva G. Narendra, Portland, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/792,262

(22) Filed: Mar. 2, 2004

(51) Int. Cl.[7] .................................................. H03K 3/01
(52) U.S. Cl. ........................................ 327/513; 327/534
(58) Field of Search ................................ 327/512, 513, 327/530, 534, 535, 537, 540, 543

(56) References Cited

U.S. PATENT DOCUMENTS 6,087,892 A * 7/2000 Burr ........................... 327/534

* cited by examiner

*Primary Examiner*—Jeffrey Zweizig
(74) *Attorney, Agent, or Firm*—Jeffrey B. Huter

(57) ABSTRACT

Embodiments circuits provide a transistor body bias voltage so that the ratio of $I_{ON}$ to $I_{OFF}$ is constant over a range of temperature, where $I_{ON}$ is a transistor current when ON and $I_{OFF}$ is a (leakage) transistor current when OFF. In one embodiment, a nFET is biased to provide $I_{ON}$ to a current mirror that sources a current $AI_{ON}$ to a node, a nFET is biased to provide $I_{OFF}$ to a current mirror that sinks a current $BI_{OFF}$ from the node, and an amplifier provides feedback from the node to the body terminals of the nFETs so that at steady state $AI_{ON}=BI_{OFF}$, where A and B are constants independent over a range of temperature. In this way, the ratio $I_{ON}/I_{OFF}$ is maintained at B/A for some range of temperatures. Other embodiments are described and claimed.

30 Claims, 7 Drawing Sheets

TEMPERATURE DEPENDENT REGULATION OF THRESHOLD VOLTAGE

FIELD

The present invention relates to circuits, and more particularly, to analog circuits to provide a transistor body bias voltage.

BACKGROUND

Circuits on a die may experience a wide temperature range, where changes in temperature may be both spatial and temporal in nature. This may be of concern in a computer system such as that illustrated in FIG. 1, where die 102 comprises a microprocessor with many sub-blocks, such as arithmetic logic unit (ALU) 104 and on-die cache 106. Die 102 may also communicate to other levels of cache, such as off-die cache 108. Higher memory hierarchy levels, such as system memory 110, are accessed via host bus 112 and chipset 114. In addition, other functional units not on die 102, such as graphics accelerator 116 and network interface controller (NIC) 118, to name just a few, may communicate with die 102 via appropriate busses or ports. Each of these functional units may physically reside on one die or more than one die. Some or parts of more than one functional unit may reside on the same die.

As operating frequency and transistor integration increase, one or more die used in the computer system of FIG. 1 may experience a wide range of temperatures. This may be of particular concern, but not limited to, microprocessors. The spatial variation in temperature may occur because some circuits (functional blocks) on a microprocessor die may be more active than other circuits (functional blocks) on the same die, thereby consuming more power and leading to so-called "hot spots" on the die. The temporal variation in temperature may occur because some functional units on a die are switched on or off, thereby causing a temporal change in power consumption.

A temperature change in a transistor, unless compensated for, will change the threshold voltage as well as carrier mobility of the transistor. As temperature decreases, the magnitude of the threshold voltage and carrier mobility increase. This will affect both the OFF (or leakage) current $I_{OFF}$ of the transistor as well as the ON current $I_{ON}$ of the transistor. The effect of temperature change on $I_{OFF}$ is more severe than that of $I_{ON}$. But the ratio of $I_{ON}/I_{OFF}$ affects performance robustness. Consequently, circuit designers usually try to keep this ratio greater than some minimum value, e.g., on the order of 100 to 1000, by designing a circuit to operate at its worst-case $I_{ON}/I_{OFF}$ ratio, corresponding to its expected maximum temperature. But when the temperature is lower than its expected maximum, a circuit designed for its worst-case $I_{ON}/I_{OFF}$ ratio will not operate optimally, unless other changes are made to the circuit parameters.

DESCRIPTION OF EMBODIMENTS

Because carrier mobility increases with decreasing temperature, a circuit designed for its worst-case $I_{ON}/I_{OFF}$ ratio may be made to operate faster by increasing its clock frequency to take advantage of the increased carrier mobility. However, even greater gains in circuit operation frequency than this may be realized by modulating the threshold voltage as a function of temperature. This can be accomplished by changing the body biasing of transistors as temperature changes. For example, if no changes in body biasing is made, then as temperature decreases, $I_{OFF}$ decreases significantly due to an increase in the magnitude of the threshold voltage. As a result, unless otherwise compensated for, a circuit will operate at a larger $I_{ON}/I_{OFF}$ ratio than necessary. Embodiments of the present invention change the body biasing so as to reduce the magnitude of the threshold voltage when temperature decreases, so that the $I_{ON}/I_{OFF}$ ratio may be brought back (or closer) to the design point (worst-case $I_{ON}/I_{OFF}$ ratio). The frequency of operation of the circuit may then be increased because of the reduction in the magnitude of the threshold voltage. Therefore, by modulating threshold voltage to maintain a fixed $I_{ON}/I_{OFF}$ ratio as temperature changes, the frequency may be maximized for a given temperature.

Figure 1:
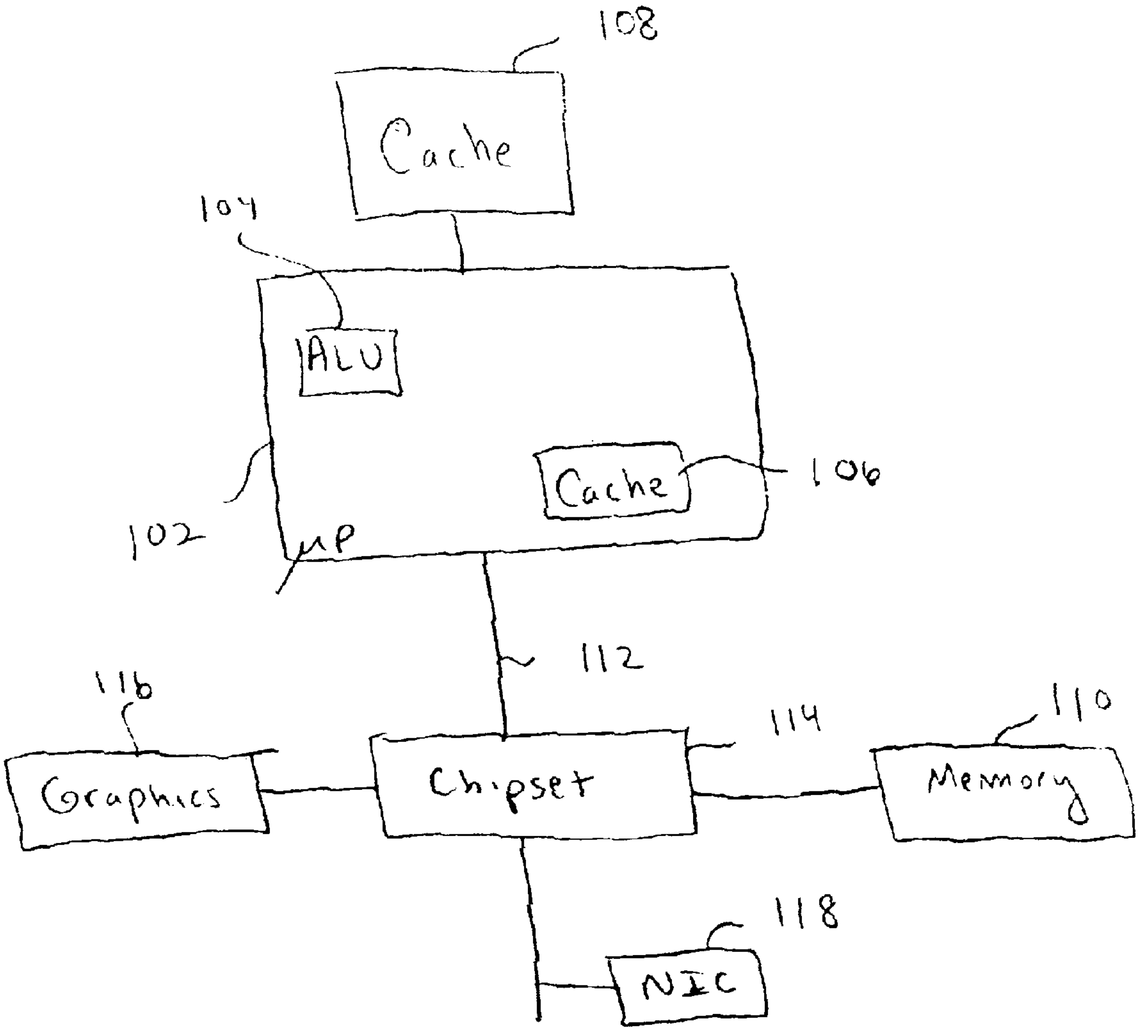
(PRIOR ART) Fig. 1
FIG. 1 illustrates a computer system.
Figure 2:
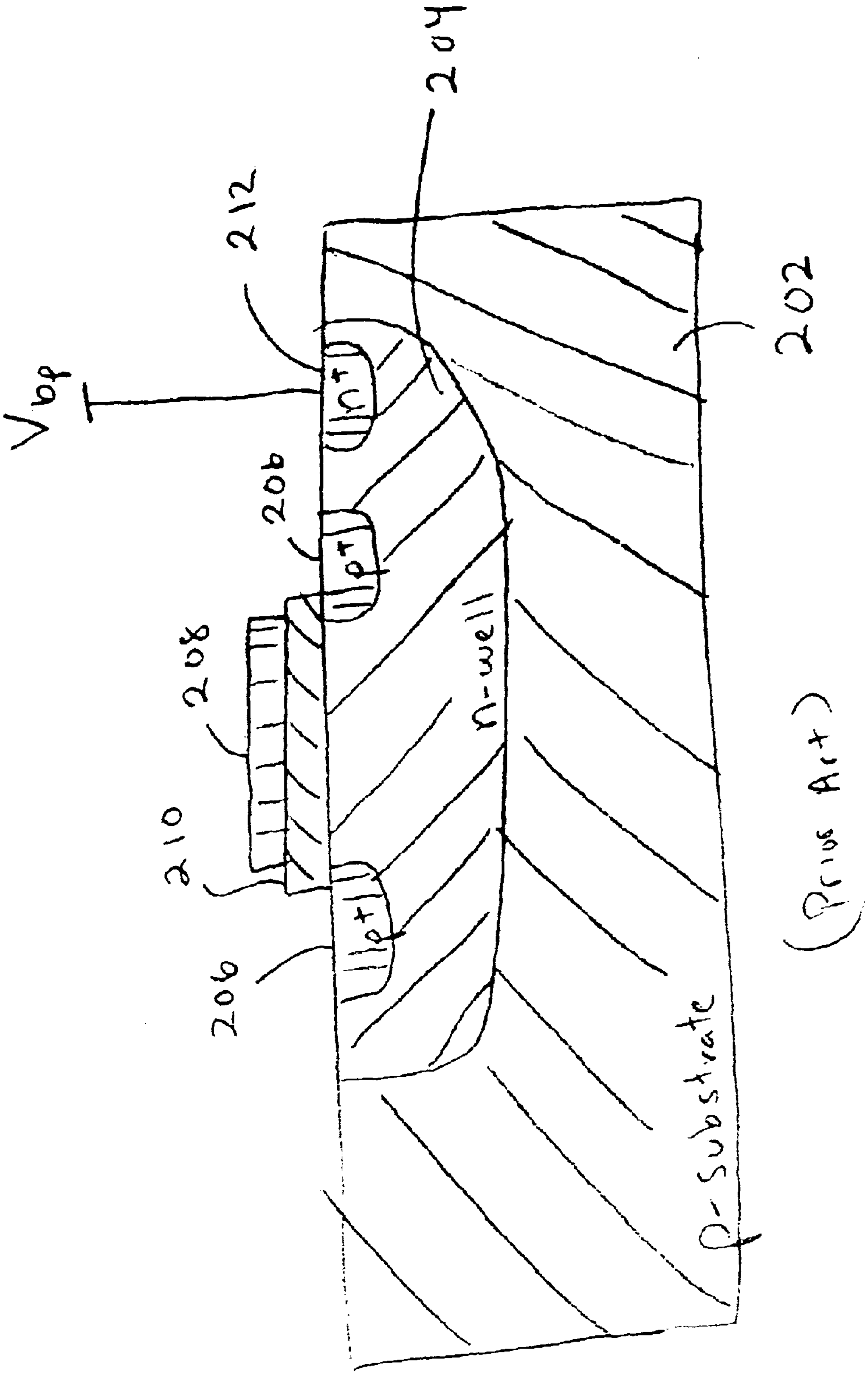
(Prior Art) Fig. 2
FIG. 2 illustrates a cross-sectional view of a body biased pFET.

Embodiments of the present invention generate a body bias voltage to decrease the magnitude of the threshold voltage when temperature decreases, and to increase the magnitude of the threshold voltage when temperature increases. The body bias may be applied to pFETs, nFETs, or both types of transistors. For example, shown in FIG. 2 is a simplified, cross-sectional view of a pFET using a n-well CMOS process. Substrate 202 is a p-substrate in which n-well 204 (the "body") has been formed. Formed within n-well 204 are source/drain terminals 206. Gate 208 is insulated from n-well 204 by insulator 210. A body terminal ($n^+$ region 212) is formed within n-well 204 so that the body may be biased at some voltage, denoted as Vbp in FIG. 2. FIG. 2 is simplified in that not all layers are shown. (For example, for simplicity, passivation layers are not shown, nor are contacts to source/drain terminals shown.) Any suitable process technology may be utilized to form the transistor of FIG. 2.

Preferably, Vbp should be chosen so as to prevent turning ON the parasitic junction diode formed by the source/drain terminals and the n-well. Typically, the body bias voltage is in the range (Vcc−500 mV) to (Vcc+500 mV), where Vcc is the supply voltage. The lower end of the range represents forward body biasing so as to decrease the magnitude of the threshold voltage, whereas the upper end of the range represents reverse body biasing so as to increase the magnitude of the threshold voltage.

In the case of body biasing a nFET, a $p^+$ region is formed in the channel of a nFET to serve as a body terminal. Again, the body bias voltage should be chosen so as to prevent turning ON the parasitic junction diode formed by the source/drain terminals and the p-substrate. Typically, the body bias voltage is in the range (Vss−500 mV) to (Vss+500 mV), where Vss is the ground of the circuit. The lower end of the range represents reverse body biasing so as to increase the magnitude of the threshold voltage, whereas the upper end of the range represents forward body biasing so as to decrease the magnitude of the threshold voltage.

Figure 3:
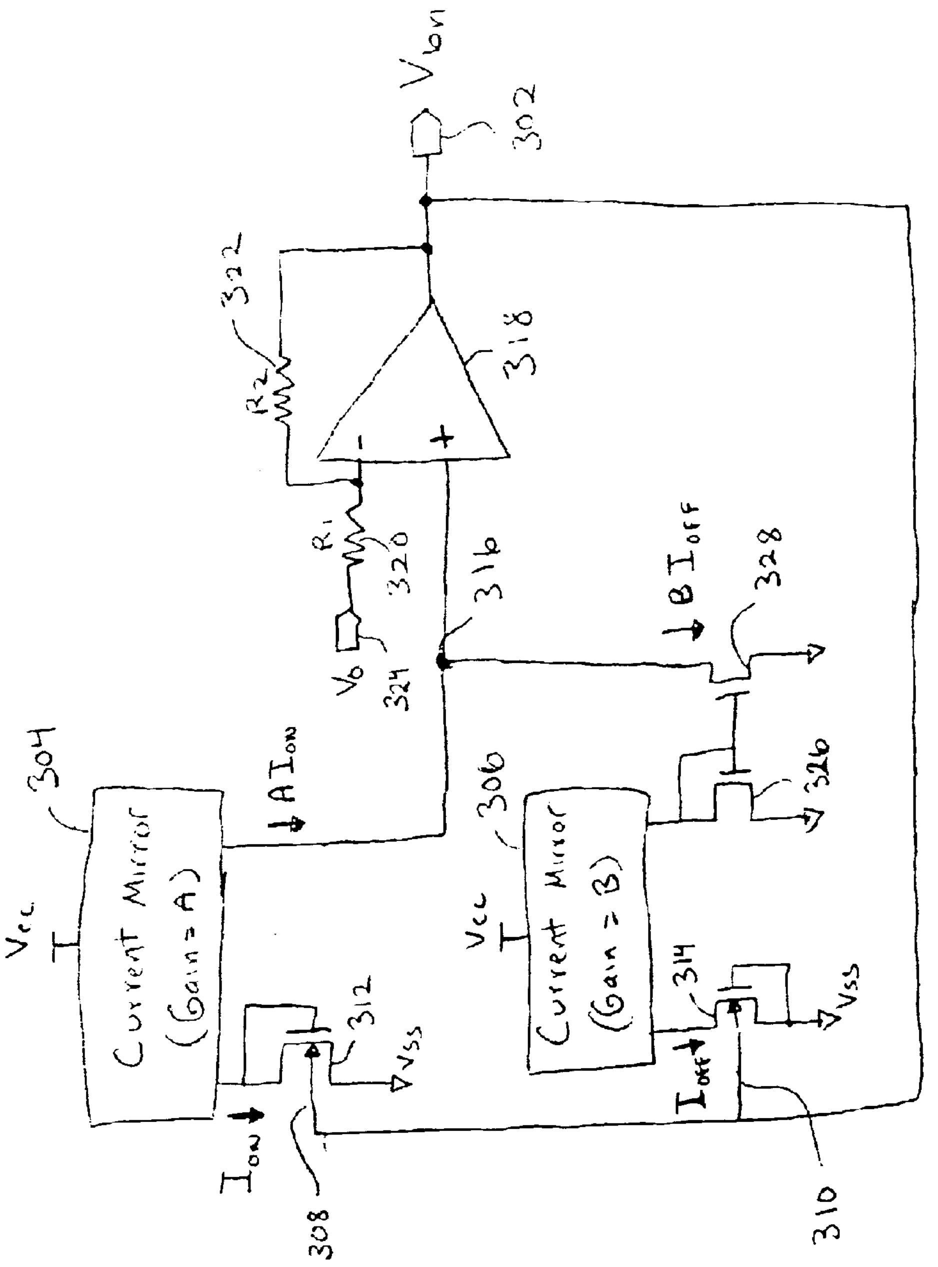
FIG. 3 illustrates a circuit according to an embodiment of the present invention utilizing biased nFETs.

An embodiment circuit for body biasing nFETs is shown in FIG. 3, providing at output port 302 the bias voltage Vbn to bias the body or bodies of one or more nFETs in another circuit, such as, for example, a functional unit block within a microprocessor. In the circuit of FIG. 3, current mirror 304 provides a gain of A and is biased by nFET 312. The gate of nFET 312 is connected to its drain so that it is biased at $I_{ON}$. Current mirror 306 provides a gain of B and is biased by nFET 314. The gate of nFET 314 is connected to its source so that it is biased at $I_{OFF}$. Transistors 312 and 314 are placed relatively close to each other, and to the circuit to be biased, so that they are essentially at the same temperature as the circuit to which Vbn is applied.

In general, transistors 312 and 314 need not have the same width or length. However, it is preferable that they have the same length as each other, and the same length as the transistors to be biased, so that $I_{ON}$ and $I_{OFF}$ track temperature in the same way. If transistors 312 and 314 do not have the same width, then this should be taken into account when setting the current mirror gains so as to realize the desired $I_{ON}/I_{OFF}$ ratio. This will be discussed in more detail later. For the present discussion, assume that transistors 312 and 314 have the same width and length.

The combination of OPAMP 318 and resistors 320 and 322 provide the input-output functional relationship $Vbn=(1+R_2/R_1)V_1-(R_2/R_1)V_0$, where $R_2$ and $R_1$ are the resistances of resistors 322 and 320, respectively, $V_1$ is the voltage at node 316 (which is the input port of OPAMP 318), and $V_0$ is an offset voltage provided at input port 324. The circuit design parameters $R_1$, $R_2$, and $V_0$, as well as A and B, among others, are chosen so that Vbn is in the range (Vss−500 mV) to (Vss+500 mV).

The significance of the current mirror gains is that the path from node 316 through the amplifier comprising OPAMP 318 and resistors 320 and 322, to the body terminals 308 and 310 of nFETs 312 and 314, respectively, and to node 316 via the current mirrors, comprises a negative feedback loop such that under steady state $AI_{ON}=BI_{OFF}$. When steady state is reached, it is also assumed that there is thermal equilibrium, or near thermal equilibrium, locally so that nFETs 312 and 314 are at a well-defined temperature. Thus, A and B are chosen to set the $I_{ON}/I_{OFF}$ ratio, that is, under steady state $I_{ON}/I_{OFF}=B/A$. (This assumes that the various current mirrors are operating in their saturation regions so that current mirrors 304 and 306 are providing constant gains A and B, respectively, and that the other circuit parameters, such as $R_2$, $R_2$, $V_0$, etc., are properly chosen.)

To describe the negative feedback, suppose the circuit has stabilized at a constant temperature so that $AI_{ON}=BI_{OFF}$. Now suppose there is a sudden decrease in the temperature at nFETs 312 and, 314. This will tend to cause a decrease in $I_{ON}$ and a much more significant decrease in $I_{OFF}$, so that now $AI_{ON}>BI_{OFF}$ and the ratio $I_{ON}/I_{OFF}$ has increased relative to its steady state value. But with current mirror 304 trying to source $AI_{ON}$ into node 316, and with the current mirror comprising nFEFs 326 and 328 trying to sink $BI_{OFF}$ from node 316, where $AI_{ON}>BI_{OFF}$, the voltage at node 316 will rise. But a rise in this voltage at node 316 will cause a rise in Vbn at output port 302, which is fed back to body terminals 308 and 310. This will increase the forward body bias of nFETs 312 and 314. This increase in forward body bias will decrease the effective threshold voltage of nFETs 312 and 314, which will cause an increase in $I_{ON}$ and a much more significant increase in $I_{OFF}$ so as to decrease the ratio $I_{ON}/I_{OFF}$.

Thus, with a sudden temperature decrease that causes an increase in $I_{ON}/I_{OFF}$, negative feedback will decrease $I_{ON}/I_{OFF}$. Similar reasoning will show that with a sudden temperature increase that causes a decrease in $I_{ON}/I_{OFF}$, negative feedback will increase in $I_{ON}/I_{OFF}$. Consequently, there is negative feedback such that a change in $I_{ON}/I_{OFF}$ is countered by an opposite change in $I_{ON}/I_{OFF}$, and the steady state is $AI_{ON}=BI_{OFF}$.

Figure 4:
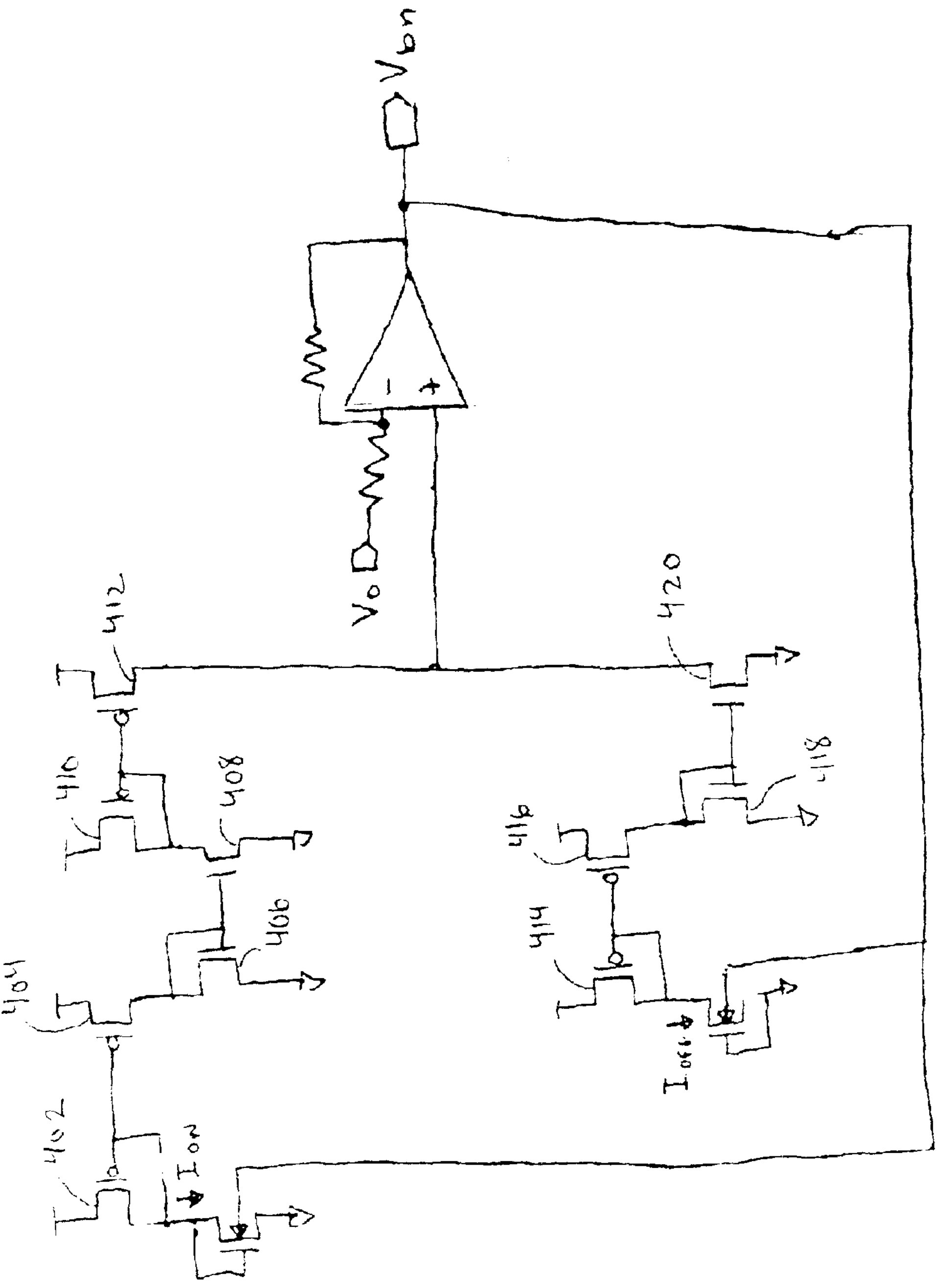
FIG. 4 illustrates a particular implementation of the embodiment of FIG. 3.

Current mirrors 304 and 306 may be single-stage current mirrors, but they may also each comprise more than one stage in order to achieve $I_{ON}/I_{OFF}$ ratios of 100 to 1000. An embodiment of these current mirrors is provided in FIG. 4. Here, the combination of transistors 402, 404, 406, 408, 410, and 412 realize current mirror 304; and the combination of transistors 414 and 416 realize current mirror 306. Note that transistors 418 and 420 could be lumped together with transistors 414 and 416 so that the combination of transistors 414, 416, 418, and 420 realize a current mirror. That is, referring to FIG. 3, transistors 326 and 328 and current mirror 306 could be considered together as a current mirror.

Figure 5:
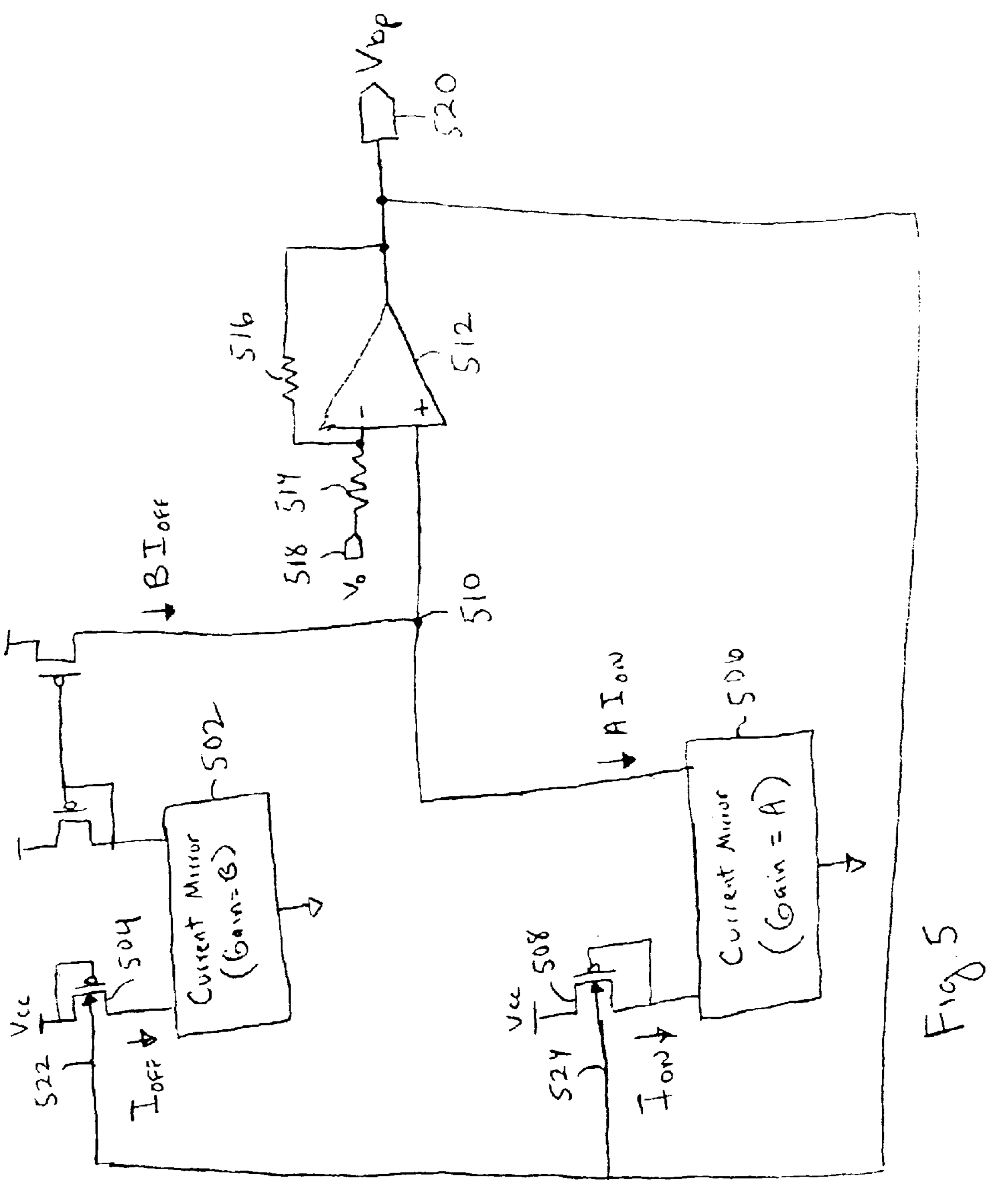
FIG. 5 illustrates a circuit according to an embodiment of the present invention utilizing biased pFETs.

An embodiment providing a bias voltage Vbp to bias pFETs is shown in FIG. 5. Current mirror 502 is biased by pFET 504, which has its gate connected to its source to provide a source-drain current $I_{OFF}$. Current mirror 506 is biased by pFET 508, which has its gate connected to its drain to provide a source-drain current $I_{ON}$. Note that the current mirrors in FIG. 5 are configured so that a current $BI_{OFF}$ is sourced to node 510 and a current $AI_{ON}$ is sunk from node 510. Node 510 is connected to the non-inverting input port of OPAMP 512, and OPAMP 512 and resistors 514 and 516 are configured to provide the same input-output functional relationship as their counterparts in FIG. 3. However, the values of resistors 514 and 516, as well as the offset voltage $V_0$ at input port 518 will not, in general, have the same values as their counterparts in FIG. 3. The bias voltage Vbp is provided at output port 520, which is fed back to the body terminals 522 and 524 of pFETs 504 and 508, respectively.

Similar reasoning as considered with respect to FIG. 3 will shown that the path from node 510 through the amplifier comprising OPAMP 512 and resistors 514 and 516, to the body terminals of pFETs 504 and 508, and to node 510 via the current mirrors provides negative feedback so that the circuit of FIG. 5 has a steady state condition such that $AI_{ON}=BI_{OFF}$. Again, as discussed with respect to FIG. 3, the current mirrors in FIG. 5 may comprise single stage or multiple stage current mirrors.

Figure 6:
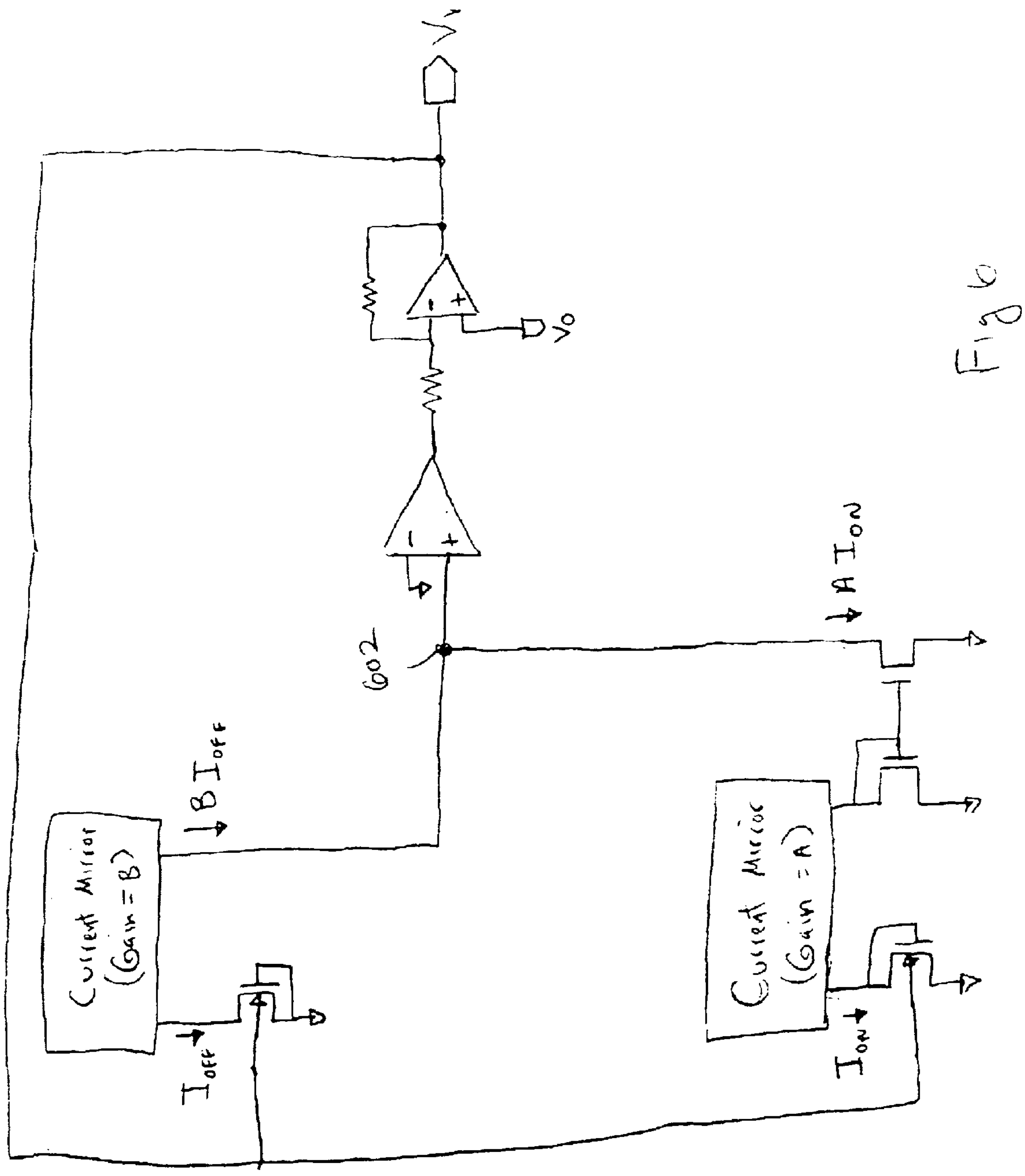
FIG. 6 illustrates a circuit according to another embodiment of the present invention utilizing biased nFETs.
Figure 7:
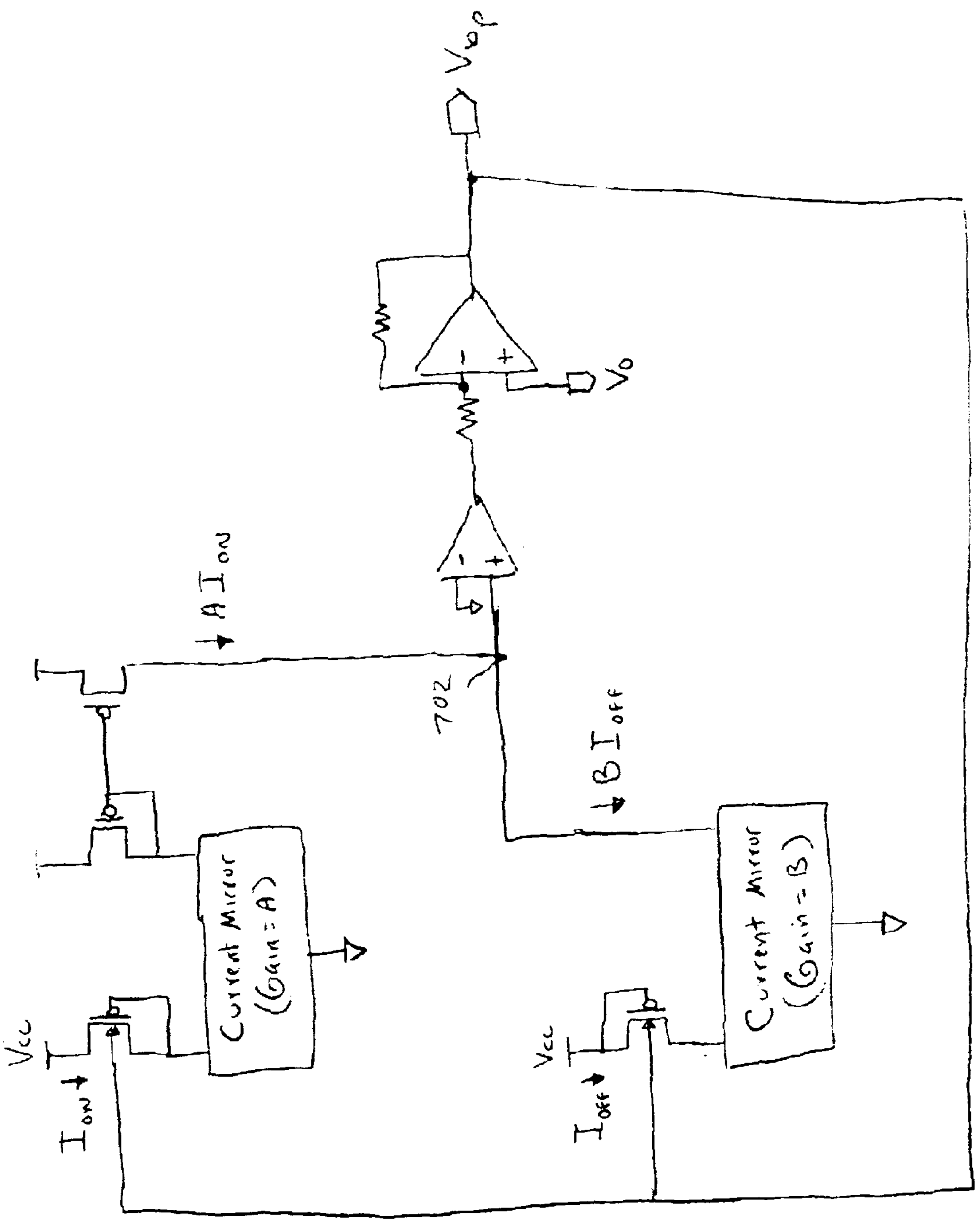
FIG. 7 illustrates a circuit according to another embodiment of the present invention utilizing biased pFETs.

Various modifications may be made to the disclosed embodiments without departing from the scope of the invention as claimed below. For example, FIGS. 6 and 7 provide alternate circuits for providing bias voltages Vbn and Vbp, respectively. Note that in FIGS. 6 and 7, a voltage source follower precedes the OPAMP configuration. In this way, nodes 602 and 702 are not loaded and negative feedback is provided as discussed with respect to the previously disclosed embodiments.

As another example of a modification to the disclosed embodiments, programmability may be built into the disclosed circuits to allow tuning under various process conditions. For example, current mirrors 304 and 306 in FIG. 3, as well as the other current mirrors in the other disclosed embodiments, may be made programmable by switching various transistors into the current mirrors to vary current mirror gain. This would allow specification of the $I_{ON}/I_{OFF}$ ratio after die fabrication. Also, the OPAMP may also be tuned to apply the correct bias voltage for a given temperature. This could be achieved by varying the offset, voltage applied to one of the OPAMP input ports.

As discussed previously, transistors 312 and 314 need not have the same width. For example, we could let $I_{ON}$ and $I_{OFF}$ represent the ON-current and leakage current per unit transistor width, respectively. Consider FIG. 3 again. Letting $W_{ON}$ denote the width of transistor 312 and $W_{OFF}$ the width of transistor 314, a current $AW_{ON}I_{ON}$ is sourced to node 316 and a current $BW_{OFF}I_{OFF}$ is sunk from node 316. Then, the circuit sets $AW_{ON}I_{ON}=BW_{OFF}I_{OFF}$ so that now $I_{ON}/I_{OFF}=BW_{OFF}/AW_{ON}$. Thus, in the previous circuit descriptions, one may replace A with $AW_{ON}$ and B with $BW_{OFF}$ with the interpretation that $I_{ON}$ is the ON-current per device width and $I_{OFF}$ is the leakage current per device width. The widths and current gains are chosen so that the ratio $BW_{OFF}/AW_{ON}$ provides the desired ratio of ON-current per device width to leakage current per device width.

It is to be understood in these letters patent that the meaning of "A is connected to B" (A and B as used here are phrases, not the current mirror gains) is that A and B are connected by a passive structure for making a direct electrical connection so that the voltage potentials of A and B are substantially equal to each other. For example, A and B may be connected by way of an interconnect, transmission line, etc. In integrated circuit technology, the "interconnect" may be exceedingly short, comparable to the device dimension itself. For example, the gates of two transistors may be connected to each other by polysilicon or copper interconnect that is comparable to the gate length of the transistors.

It is also to be understood that the meaning of "A is coupled to B" is that either and B are connected to each other as described above, or that, although A and B may not be connected to each other as described above, there is nevertheless a device or circuit that is connected to both A and B. This device or circuit may include active or passive circuit elements. For example, A may be connected to a circuit element which in turn is connected to B.

It is also to be understood that the term "current mirror" may include a single stage current mirror, or a multiple stage current mirror.

It is also to be understood that various circuit blocks, such as current mirrors, amplifiers, etc., may include switches so as to be switched in or out of a larger circuit, and yet such circuit blocks may still be considered connected to the larger circuit because the various switches may be considered as included in the circuit block.

What is claimed is:

1. An apparatus comprising:

a first transistor having a current $I_{ON}$ when ON;

a second transistor having a current $I_{OFF}$ when OFF; and a circuit to body bias the first and second transistors so that when the first and second transistors are at thermal equilibrium with a temperature, the ratio of $I_{ON}$ to $I_{OFF}$ is independent of temperature for a range of temperature values.

2. The apparatus as set forth in claim 1, the apparatus comprising at least one transistor, wherein the circuit body biases the at least one transistor.

3. The apparatus as set forth in claim 1, wherein the first transistor is a nFET and the second transistor is a nFET.

4. The apparatus as set forth in claim 1, wherein the first transistor is a pFET and the second transistor is a pFET.

5. The apparatus as set forth in claim 1, wherein the first transistor has a first channel length, and the second transistor has a second channel length equal to the first channel length.

6. The apparatus as set forth in claim 5, wherein the first transistor has a first channel width, and the second transistor has a second channel width equal to the first channel width.

7. The apparatus as set forth in claim 1, the first transistor comprising a body terminal and the second transistor comprising a body terminal, the circuit comprising:

a node;

a first current mirror connected to the first transistor and the node;

a second current mirror connected to the second transistor and the node; and an amplifier comprising an input port connected to the node and an output port connected to the body terminals of the first and second transistors.

8. A circuit comprising:

a node;

a first transistor comprising a body terminal, the first transistor to provide a current $I_{ON}$ when ON;

a first current mirror coupled to the first transistor to source to the node a first current proportional to $I_{ON}$;

a second transistor comprising a body terminal, the second transistor to provide a current $I_{OFF}$ when OFF;

a second current mirror coupled to the first transistor to sink from the node a second current proportional to $I_{OFF}$, and an amplifier coupled to the node and to provide a bias voltage to the body terminals of the first and second transistors so that under steady state the first and second currents are equal to each other.

9. The circuit as set forth in claim 8, wherein the first transistor is a nFET comprising a gate, and a drain connected to its gate;

the second transistor is a nFET comprising a gate, and a source connected to its gate.

10. The circuit as set forth in claim 8, wherein the first transistor is a pFET comprising a gate, and a drain connected to its gate;

the second transistor is a pFET comprising a gate, and a source connected to its gate.

11. The circuit as set forth in claim 8, wherein the first transistor has a first channel length, and the second transistor has a second channel length equal to the first channel length.

12. The apparatus as set forth in claim 11, wherein the first transistor has a first channel width, and the second transistor has a second channel width equal to the first channel width.

13. A circuit comprising:

a node;

a first transistor comprising a body terminal, the first transistor to provide a current $I_{ON}$ when ON;

a first current mirror coupled to the first transistor to sink from the node a first current proportional to $I_{ON}$;

a second transistor comprising a body terminal, the second transistor to provide a current $I_{OFF}$ when OFF;

a second current mirror coupled to the second transistor to source to the node a second current proportional to $I_{OFF}$, and an amplifier coupled to the node and to provide a bias voltage to the body terminals of the first and second transistors so that under steady state the first and second currents are equal to each other.

14. The circuit as set forth in claim 13, wherein the first transistor is a nFET comprising a gate, and a drain connected to its gate;

the second transistor is a nFET comprising a gate, and a source connected to its gate.

15. The circuit as set forth in claim 13, wherein the first transistor is a pFET comprising a gate, and a drain connected to its gate;

the second transistor is a pFET comprising a gate, and a source connected to its gate.

16. The circuit as set forth in claim 13, wherein the first transistor has a first channel length, and the second transistor has a second channel length equal to the first channel length.

17. The apparatus as set forth in claim 16, wherein the first transistor has a first channel width, and the second transistor has a second channel width equal to the first channel width.

18. A circuit comprising:

a node;

a first transistor comprising a body terminal, and having a current $I_{ON}$ when ON;

a first current mirror connected to the first transistor to mirror $I_{ON}$ with a first gain to the node;

a second transistor comprising a body terminal, and having a current $I_{OFF}$ when OFF;

a second current mirror connected to the second transistor to mirror $I_{OFF}$ with a second gain from the node; and an amplifier comprising an input port connected to the node and comprising an output port connected to the body terminals of the first and second transistors.

19. The circuit as set forth in claim 18, wherein the first transistor is a nFET and the second transistor is a nFET, wherein the amplifier has an input-output relationship $V_{out}=\alpha V_{node}+V_0$, where is a is a positive scalar and $V_0$ is an offset voltage.

20. The circuit as set forth in claim 18, wherein the first transistor is a pFET and the second transistor is a pFET, wherein the amplifier has an input-output relationship $V_{out}=\alpha V_{node}+V_0$, where is a is a negative scalar and $V_0$ is an offset voltage.

21. The circuit as set forth in claim 18, wherein the first transistor has a first channel length, and the second transistor has a second channel length equal to the first channel length.

22. The apparatus as set forth in claim 21, wherein the first transistor has a first channel width, and the second transistor has a second channel width equal to the first channel width.

23. A circuit comprising:

a node;

a first transistor comprising a body terminal, and having a current $I_{ON}$ when ON;

a first current mirror connected to the first transistor to mirror $I_{ON}$ with a first gain from the node;

a second transistor comprising a body terminal, and having a current $I_{OFF}$ when OFF;

a second current mirror connected to the second transistor to mirror $I_{OFF}$ with a second gain to the node; and an amplifier comprising an input port connected to the node and comprising an output port connected to the body terminals of the first and second transistors.

24. The circuit as set forth in claim 23, wherein the first transistor is a nFET and the second transistor is a nFET, wherein the amplifier has an input-output relationship $V_{out}=\alpha V_{node}+V_0$, where is a is a negative scalar and $V_0$ is an offset voltage.

25. The circuit as set forth in claim 23, wherein the first transistor is a pFET and the second transistor is a pFET, wherein the amplifier has an input-output relationship $V_{out}=\alpha V_{node}+V_0$, where is a is a positive scalar and $V_0$ is an offset voltage.

26. The circuit as set forth in claim 23, wherein the first transistor has a first channel length, and the second transistor has a second channel length equal to the first channel length.

27. The apparatus as set forth in claim 26, wherein the first transistor has a first channel width, and the second transistor has a second channel width equal to the first channel width.

28. A system comprising a die and a cache not on the die, the die comprising:

a first transistor having a current $I_{ON}$ when ON;

a second transistor having a current $I_{OFF}$ when OFF; and a circuit to body bias the first and second transistors so that when the first and second transistors are at thermal equilibrium with a temperature, the ratio of $I_{ON}$ to $I_{OFF}$ is independent of temperature for a range of temperature values.

29. The system as set forth in claim 28, the die comprising at least one transistor, wherein the circuit body biases the at least one transistor.

30. The system as set forth in claim 28, the first transistor comprising a body terminal and the second transistor comprising a body terminal, the circuit comprising:

a node;

a first current mirror connected to the first transistor and the node;

a second current mirror connected to the second transistor and the node; and an amplifier comprising an input port connected to the node and an output port connected to the body terminals of the first and second transistors.

* * * * *

UNITED STATES PATENT AND TRADEMARK OFFICE

CERTIFICATE OF CORRECTION

PATENT NO. : 6,917,237 B1
DATED : July 12, 2005
INVENTOR(S) : Tschanz et al.

It is certified that error appears in the above-identified patent and that said Letters Patent is hereby corrected as shown below:

Column 7,
Lines 24 and 29, after the first occurrence of “is” delete “a” and insert -- $\alpha$ --.

Column 8,
Lines 7 and 12, after the first occurrence of “is” delete “a” and insert -- $\alpha$ --.

Signed and Sealed this

Sixth Day of September, 2005

JON W. DUDAS
*Director of the United States Patent and Trademark Office*